United States Patent [19]
Lee

[11] Patent Number: 6,098,279
[45] Date of Patent: Aug. 8, 2000

[54] METHOD FOR MAKING HEAT SINK DEVICE

[75] Inventor: Shun-Jung Lee, Pan-Chiao, Taiwan

[73] Assignee: Hon Hai Precision Ind. Co., Ltd., Taipei Hsien, Taiwan

[21] Appl. No.: 09/192,879

[22] Filed: Nov. 16, 1998

[30] Foreign Application Priority Data

Nov. 14, 1997 [TW] Taiwan ................................. 86116954

[51] Int. Cl.[7] ..................................................... H05K 3/30
[52] U.S. Cl. ........................... 29/832; 165/185; 257/713; 257/714
[58] Field of Search ............................. 29/832, 825, 840, 29/841, 844, 843; 257/713, 714; 165/185

[56] References Cited

U.S. PATENT DOCUMENTS

| | | |
|---|---|---|
| 5,168,348 | 12/1992 | Chu et al. . |
| 5,270,902 | 12/1993 | Bellar et al. . |
| 5,285,108 | 2/1994 | Hastings et al. . |
| 5,387,139 | 2/1995 | McKee et al. ...................... 29/843 X |
| 5,533,257 | 7/1996 | Romero et al. . |
| 5,653,280 | 8/1997 | Porter . |
| 5,791,406 | 8/1998 | Gönner et al. . |
| 5,886,870 | 3/1999 | Omori . |
| 6,021,045 | 2/2000 | Johnson . |

FOREIGN PATENT DOCUMENTS 10-242357  9/1998  Japan .

*Primary Examiner*—Carl J. Arbes
*Attorney, Agent, or Firm*—Wei Te Chung

[57] ABSTRACT

A method for making a heat sink device, comprises the steps of: 1) forming an second cooling fins strip from a material sheet; 2) providing a substrate having at least two rows of mounting holes; 3) inserting each second cooling fin into the corresponding mounting hole; and 4) cutting a redundant material portion from the second cooling fins.

8 Claims, 10 Drawing Sheets

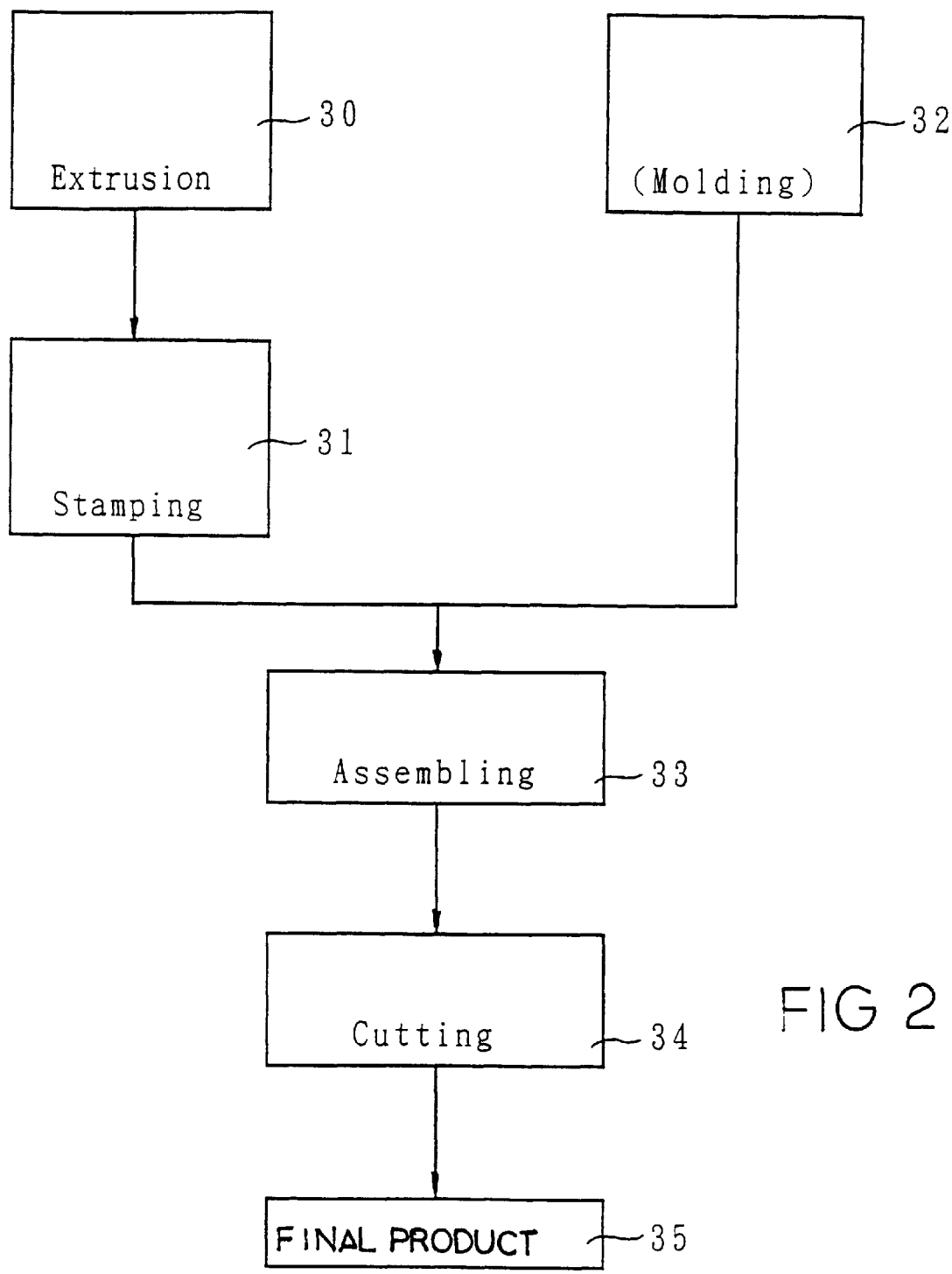

METHOD FOR MAKING HEAT SINK DEVICE

FIELD OF THE INVENTION

The present invention relates to a method, and more particularly to a method for making a heat sink device by assembling a plurality of second cooling fins to a heat sink blank thereby forming an increased heat dissipation area.

DESCRIPTION OF PRIOR ART

Heat dissipation within a computer housing is critical for normal operation of a computer system. If the temperature within the computer housing exceeds a certain limit, the system will malfunction.

Conventionally, a CPU having a lower operating speed is simply installed in a socket mounted on a motherboard, and the heat generated by the CPU directly dissipates from a top surface thereof. As the operating speed increases gradually, heat convection from the top surface of the CPU to the surrounding air is too slow to dissipate a large amount of heat. To address this problem, a heat sink having a bottom face contacting the top surface of the CPU is introduced. By this arrangement, the total heat dissipation area is increased and the operating temperature of the CPU can be controlled to remain below an acceptable limit. However, a single heat sink is still inadequate to dissipate the heat generated from the CPU. Therefore, a cooling fan is mounted to a top of the heat sink to improve the heat dissipation performance from an outer surface of the cooling fins to the surrounding air.

Theoretically, the larger the outer surface area of the cooling fins, the better the heat dissipation performance, i.e., a higher density of cooling fins results in a betterdissipation performance. Nevertheless, the existing extruding technique limits the formation of the heat sink because it is difficult to manufacture a cooling fin of a narrow width. In order to increase the total surface area of cooling fins, U.S. Pat. Nos. 4,890,196, 5,038,858 and Taiwan Utility Patent No. 83212791 disclose a heat sink assembled from an individual substrate having a plurality of cooling fins.

As shown in FIGS. 8A and 8B, U.S. Pat. No. 5,038,858 (hereinafter referred to as '858) discloses a heat sink device 7 including a substrate 71 with a plurality of retaining grooves 711 defined in a surface thereof. Each of the retaining grooves 711 is provided with a retaining recess 712. A cooling plate 72 forming at least a hook 721 near a bottom edge thereof is inserted into the corresponding retaining groove 711. When the cooling plate 72 is inserted, the hook 721 is engaged with the retaining groove 712.

FIG. 9 illustrates another approach which involves welding a cooling plate 82 in a corresponding trench 81a defined in an upper surface 81 of a substrate to form a heat sink device 8. Even though the total surface area of the heat sink is increased, the manufacturing process is economically complex to implement. U.S. Pat. Nos. 4,712,159, 4,879,891 and Taiwan Utility Patent Nos. 84212747, 85200861, and 85206293 disclose pertinent techniques.

SUMMARY OF THE INVENTION

An objective of this invention is to provide a method for making a heat sink by assembling a plurality of second cooling fins to a heat sink blank thereby forming a heat sink having a large increased heat dissipation area.

Another objective of this invention is to provide a method for making a heat sink wherein second cooling fins can be easily assembled to a heat sink blank.

In order to achieve the objectives set forth, a method in accordance with the present invention generally comprises the steps of: 1) forming a second cooling fins strip from a material sheet; 2) providing a heat sink blank having a plurality of rows of first cooling fins; 3) defining a plurality of mounting holes in a valley formed two adjacent rows of first cooling fins; 4) inserting each second cooling fin into the corresponding mounting hole; and 5) cutting a redundant material portion from the second cooling fins.

These and second objects, features, and advantages of the present invention will become apparent after reading the following detailed description of the preferred embodiment of the invention taken in conjunction with the appended drawings.

BRIEF DESCRIPTION OF THE DRAWING

FIG. 2 is a flow chart of manufacturing process of the heat sink device in accordance with a first embodiment of the present invention;

DETAILED DESCRIPTION OF PREFERRED EMBODIMENT

Figure 1A:
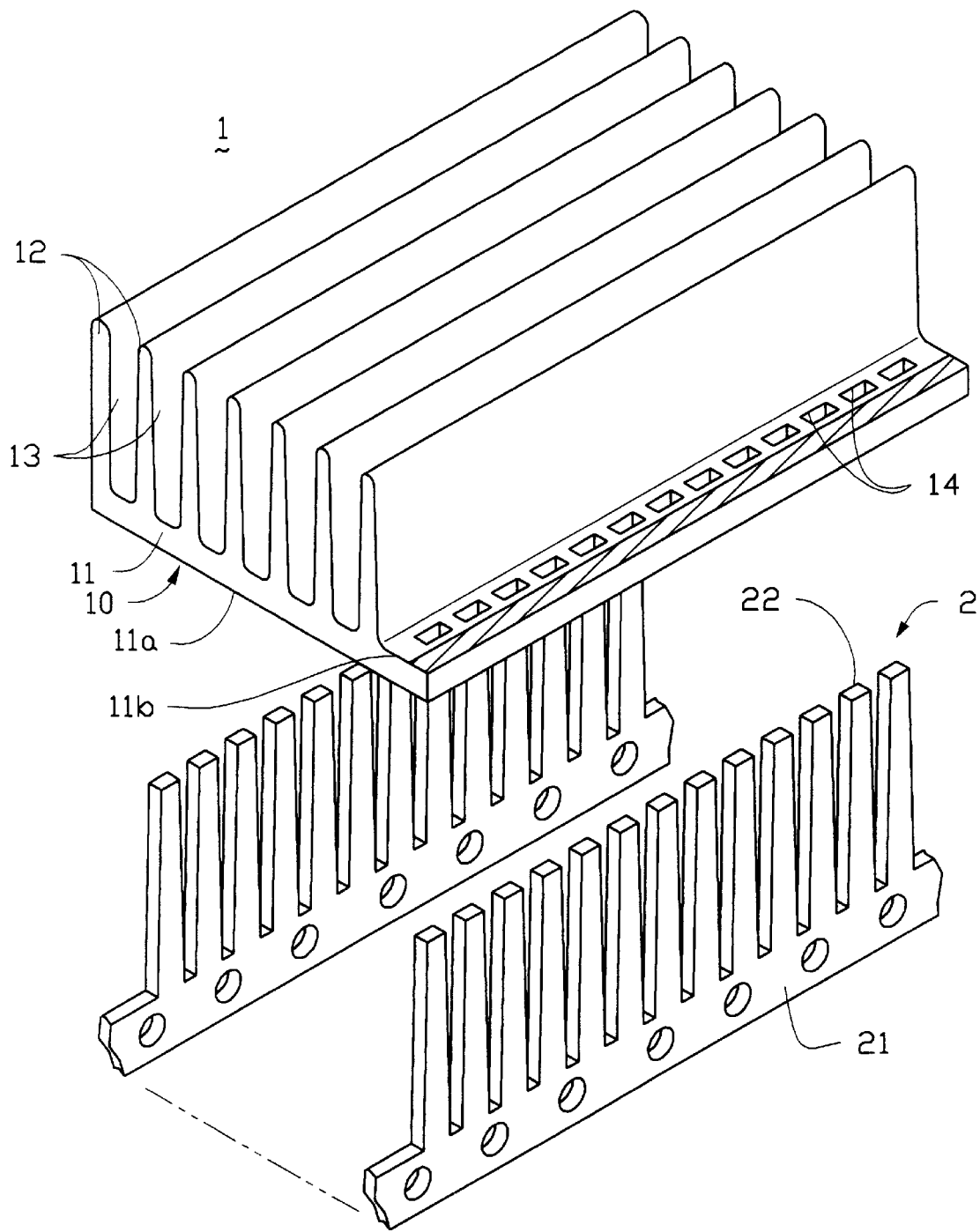
FIG. 1A is a perspective view of a heat sink including a heat sink blank and second cooling fins strip.
Figure 1B:
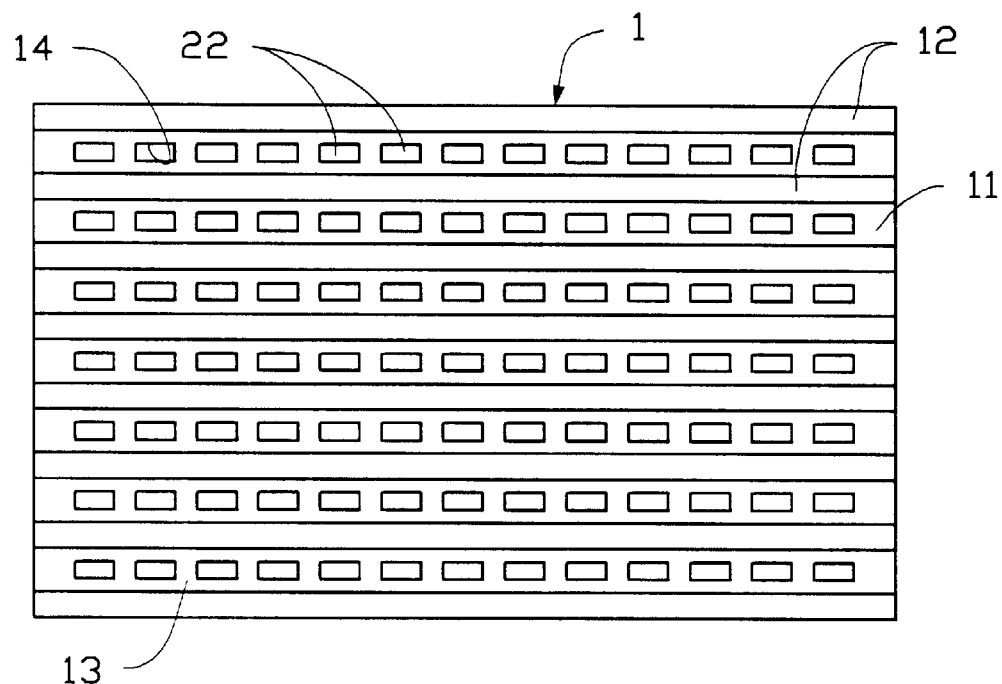
FIG. 1B is a top plan view of the heat sink of FIG. 1A.

Referring to FIGS. 1A and 1B, a heat sink device 1 comprises a heat sink blank 10 having a substrate 11 adapted to contact with a top surface of a CPU (not shown). A heat conduction path is then established between an under face 11a of the substrate and the top surface of the CPU. The heat generated by the CPU is then transferred to the substrate 11. A plurality of cooling fins 12 extend vertically from a top face 11b of the substrate 11. Air passages 13 are defined between cooling fins 12 thereby facilitating heat convection from an outer surface 12a of the cooling fins 12 to the surrounding air. The cooling fins 12 and the substrate 11 are integrally formed by an extrusion process. A plurality of mounting holes 14 are defined through the substrate 11 in communication with the passage 13 for each receiving an second cooling fin 22 therein. The second cooling fins 22 are then assembled to the heat sink blank 10. By this arrangement, the total surface area of the heat sink device 1 is increased by the provision of the second cooling fins 22.

Referring to FIG. 2, the assembly of the heat sink device 1 can be achieved by the following steps.

1) A first step 30 of extruding a heat sink blank 10 having an array of first cooling fins 12 from a molten metal having excellent heat dissipation properties;
2) A second step 31 of stamping a plurality of mounting holes 14 in a substrate 11 of the heat sink blank 10;
3) A third step 32 of forming a second cooling fin strip from a material sheet:
4) A fourth step 33 of aligning each second cooling fin strip 22 with the corresponding mounting holes and inserting the same into the corresponding mounting hole 14; and
5) A fifth step 34 of cutting a redundant material portion 21 from the second cooling fin strip 2.
6) Then a final heat sink device is attained in sixth step 15.

From the above disclosed method, the heat sink device 1 having a high cooling fin density can be readily manufactured.

Figure 1C:
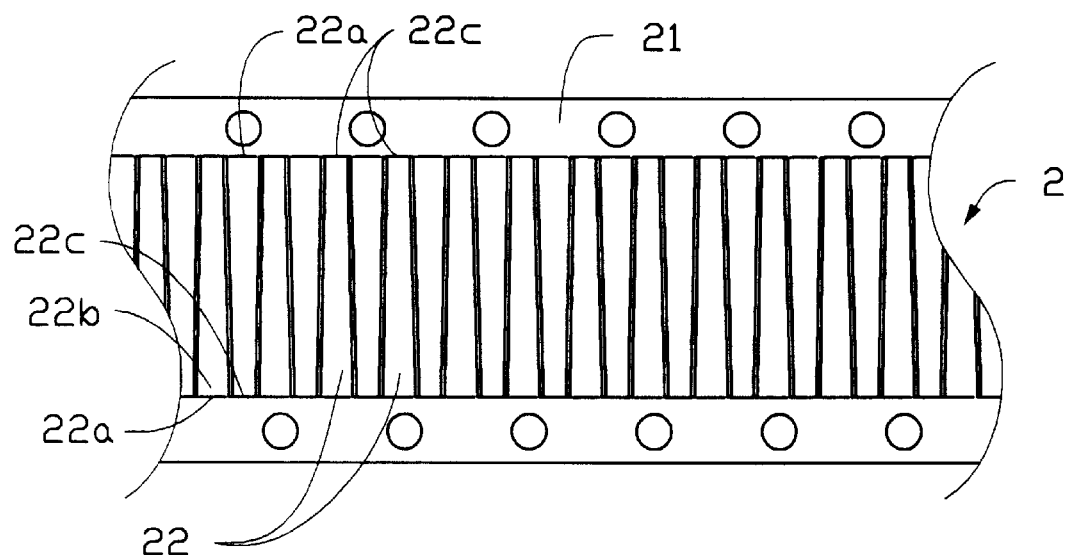
FIG. 1C is a top plan view showing a formation of the second cooling fin strips.

Referring to FIG. 1C, tow sets of second cooling fins 22 can be simultaneously stamped from a material strip 2. During the forming process, a separating groove 22a is defined in a base 22b of the second cooling fin 22. The diameter of the mounting hole 14 is smaller than the base 22b but larger than a top end 22c of the second cooling fin 22. By this arrangement, the base 22a of the second cooling fin 22 has an interferential engagement with the mounting hole 14. After each second cooling fin 22 is finally anchored, the redundant material portion 21 can be cut therefrom and a heat sink device 1 having an increased surface area is achieved.

The pitch between two adjacent second cooling fins 22 is equal to the pitch between two adjacent mounting holes 14. By this arrangement, a plurality of second cooling fins 22 can be simultaneously assembled within the mounting holes 14 which increases the assembly speed of the heat sink device 1.

Figure 3:
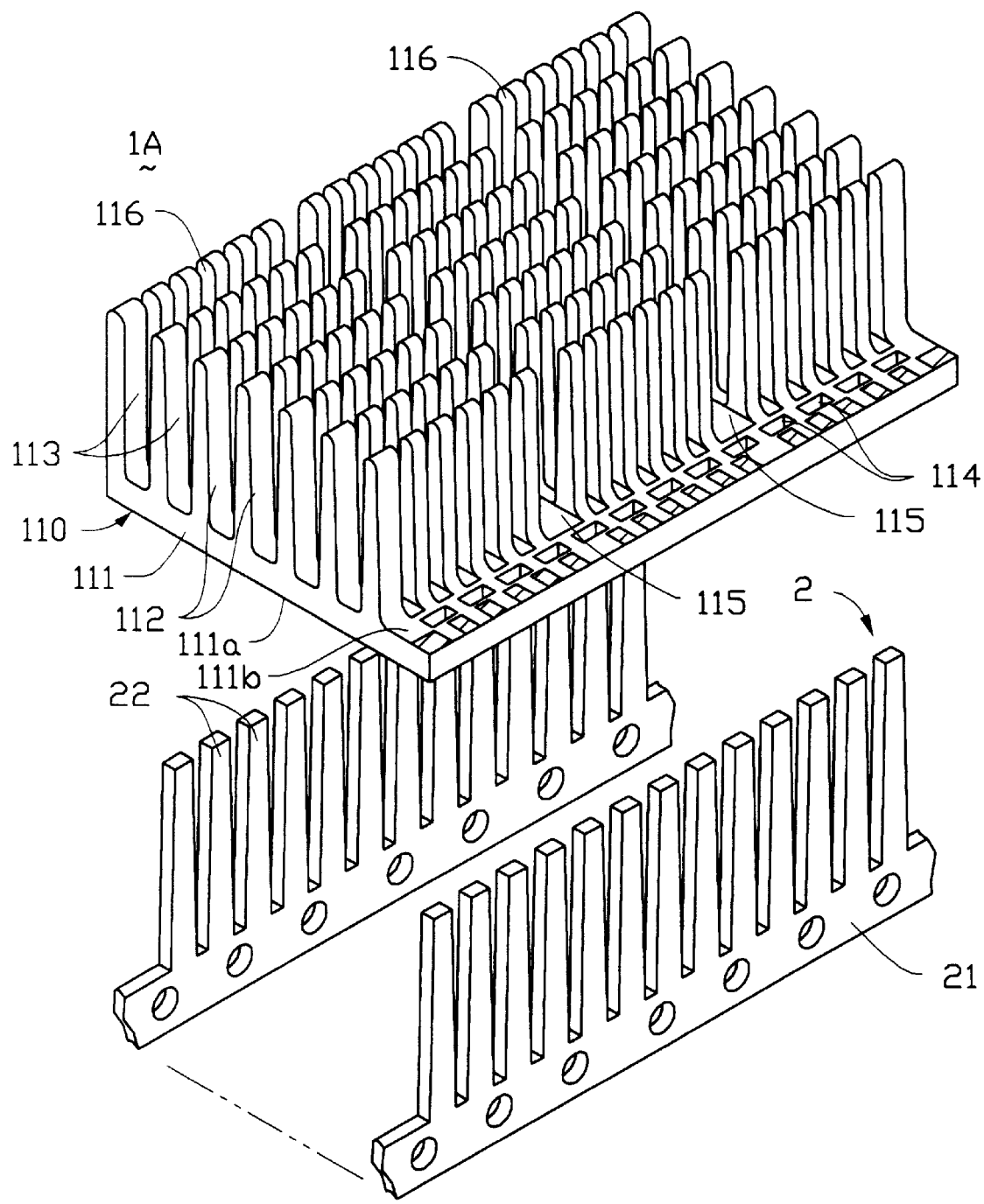
FIG. 3 is a perspective view of a heat sink made in accordance with a second embodiment of the present invention.

FIG. 3 discloses a second embodiment of a heat sink device 1A having a heat sink blank 110 including a substrate 111 defining a lower face 111a and an upper face 111b. A plurality of rows of cooling tangs 112 extend vertically from the upper face 111a and an air passages 113 are defined therebetween. The rows of cooling tangs 112 can be formed by milling the cooling fin 12 of FIG. 1 after the extruding step. The heat sink blank 110 further defines a plurality of mounting holes 114 between two adjacent tows of cooling tangs row 112. By the provision of the rows of cooling tangs 112, the overall surface area of the heat sink blank 110 is further increased.

In this embodiment, the heat sink blank 110 further defines a traverse groove 115 for receiving a clip (not shown). Accordingly, the heat sink device 1A can be attached to a top surface of a CPU (not shown). The tang rows 112 can be formed by milling the cooling fin 12 of FIG. 1 after the extruding step.

Figure 4:
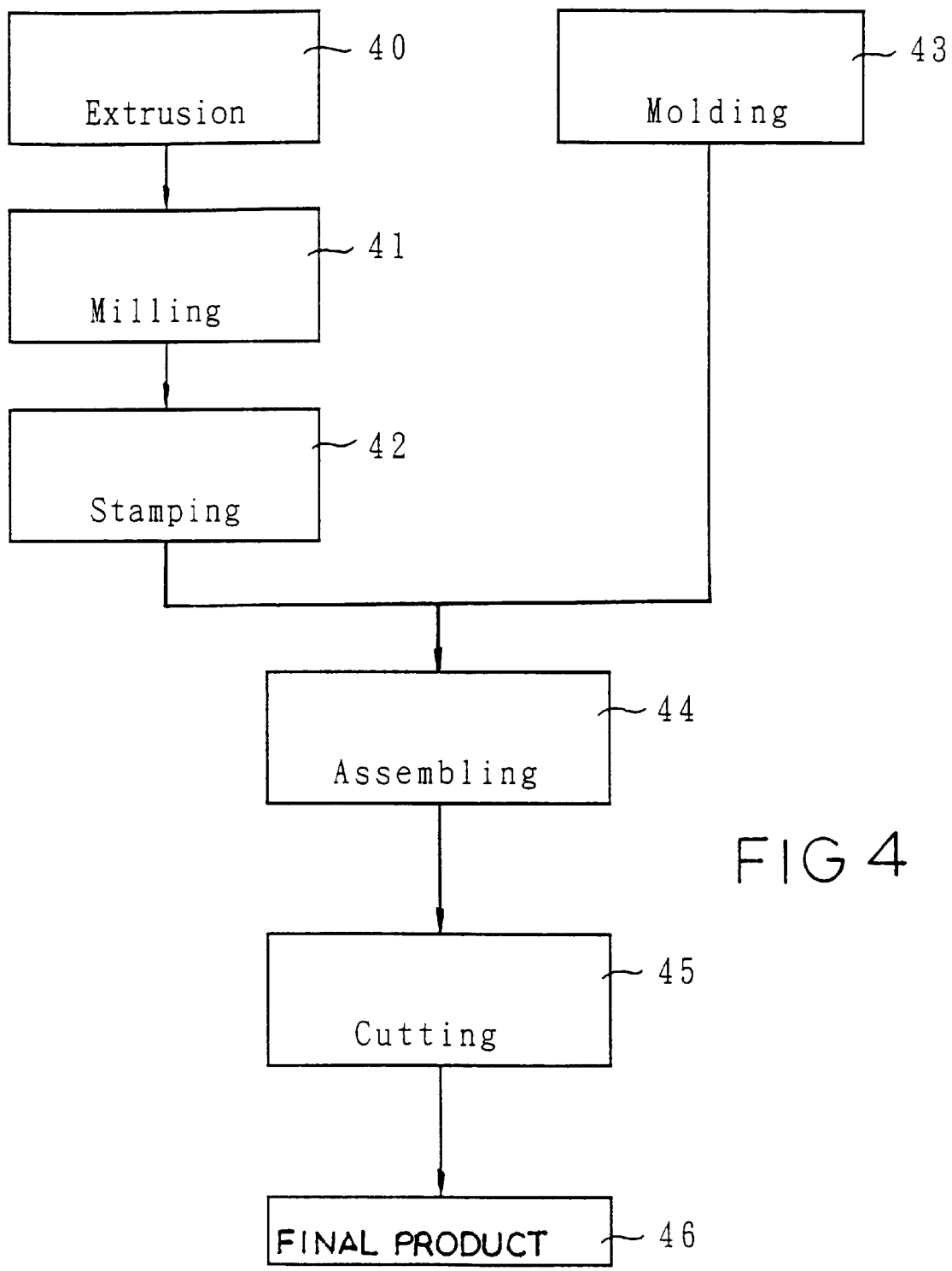
FIG. 4 is a flow chart of the manufacturing process of the heat sink in accordance with the second embodiment of the present invention.

FIG. 4 is a manufacturing process for the heat sink device 1A of FIG. 3.

1) A first step 40 of extruding a heat sink blank 110 having an array of first cooling fins 112 from a molten metal having excellent heat dissipation properties;
2) A second step 41 of milling a plurality of transverse air passage 116 along the first cooling fins 112;
3) A third step 42 of stamping a plurality of mounting holes 114 between two adjacent first cooling fins 112:
4) A fourth step 43 of molding a plurality of second cooling fins 22 from a material sheet 2;
5) A fifth step 44 of aligning each second cooling fin 22 with the corresponding mounting hole 114 and inserting the same therein; and
6) A sixth step 45 of cutting a redundant material portion 21 from the second cooling fin strip 2.
7) Then a final heat sink device 1A is attained in sixth step 46.

Figure 5:
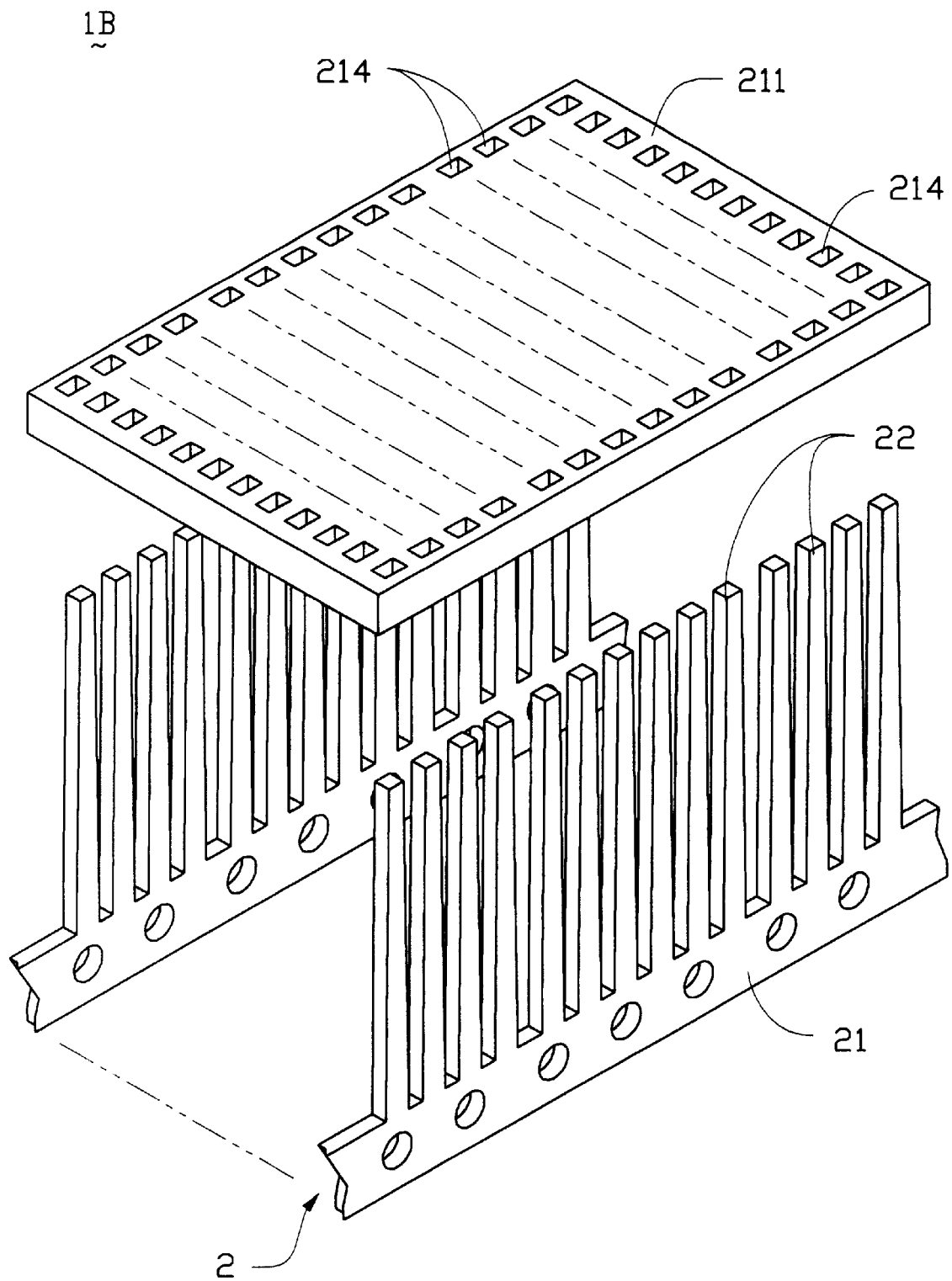
FIG. 5 is a perspective view of a heat sink made in accordance with a third embodiment of the present invention.

FIG. 5 discloses a third embodiment of the heat sink device 1B. In this embodiment, a substrate 211 is defined with a plurality of mounting holes 214 arranged in an array. A second cooling fin 22 is then inserted into the corresponding mounting hole 214. As a result, a heat sink device 1B having a large surface area is formed.

Figure 6:
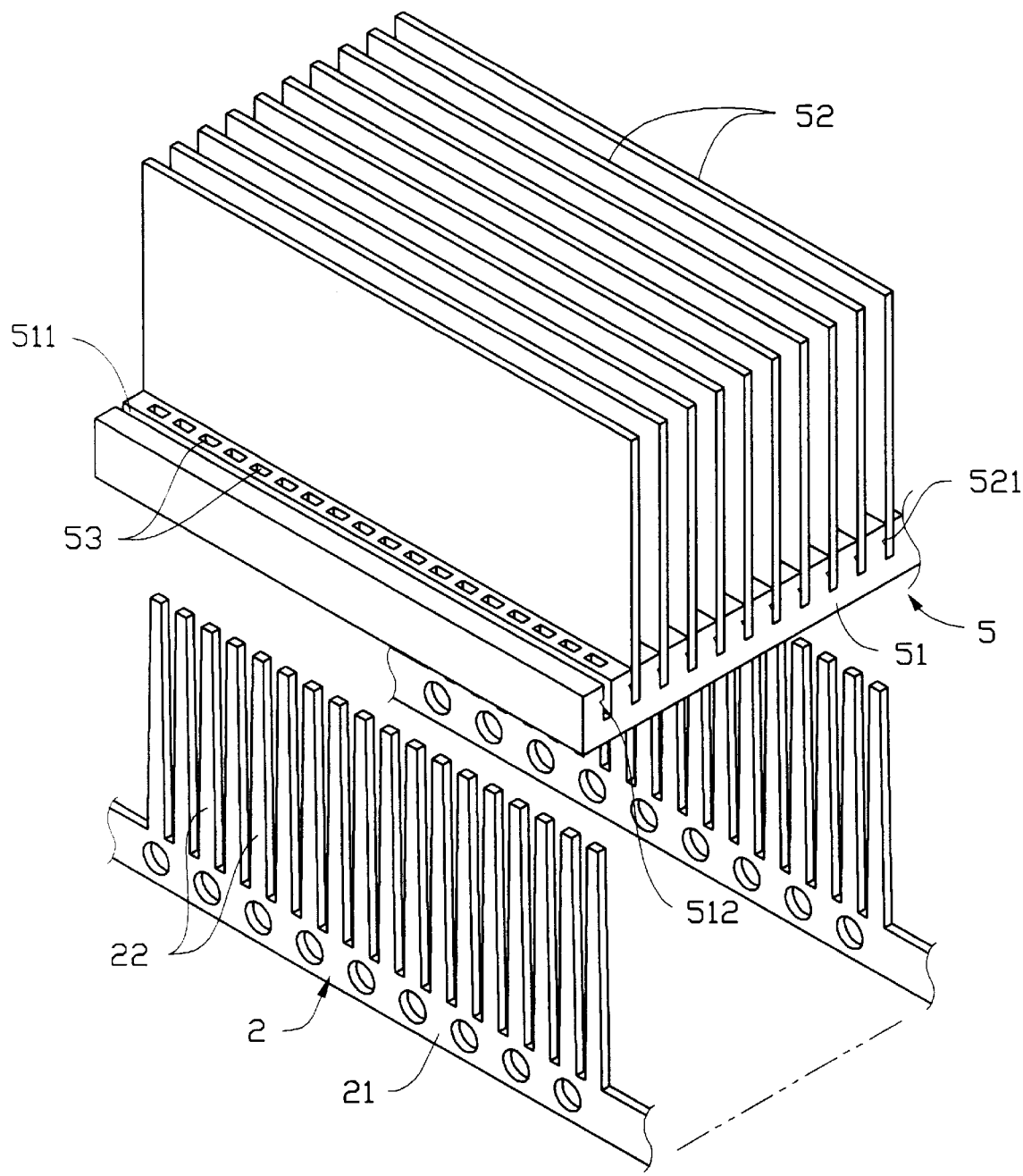
FIG. 6 is a perspective view of a heat sink made in accordance with a fourth embodiment of the present invention.

FIG. 6 illustrates an application of the second cooling fins 22 mounted onto a conventional heat sink device 5. The heat sink device 5 includes a substrate 51 defining a plurality of mounting trenches 511 therein. Each mounting trench 511 further defines a retaining recess 512 therein. A plurality of mounting holes 53 are defined between two adjacent mounting trenches 511. A cooling plate 52 is inserted into the corresponding mounting trench 511, a hook 521 of the cooling plate 52 is interferentially engaged with the retaining recess 512. Thus, the overall surface area is increased.

Figure 7:
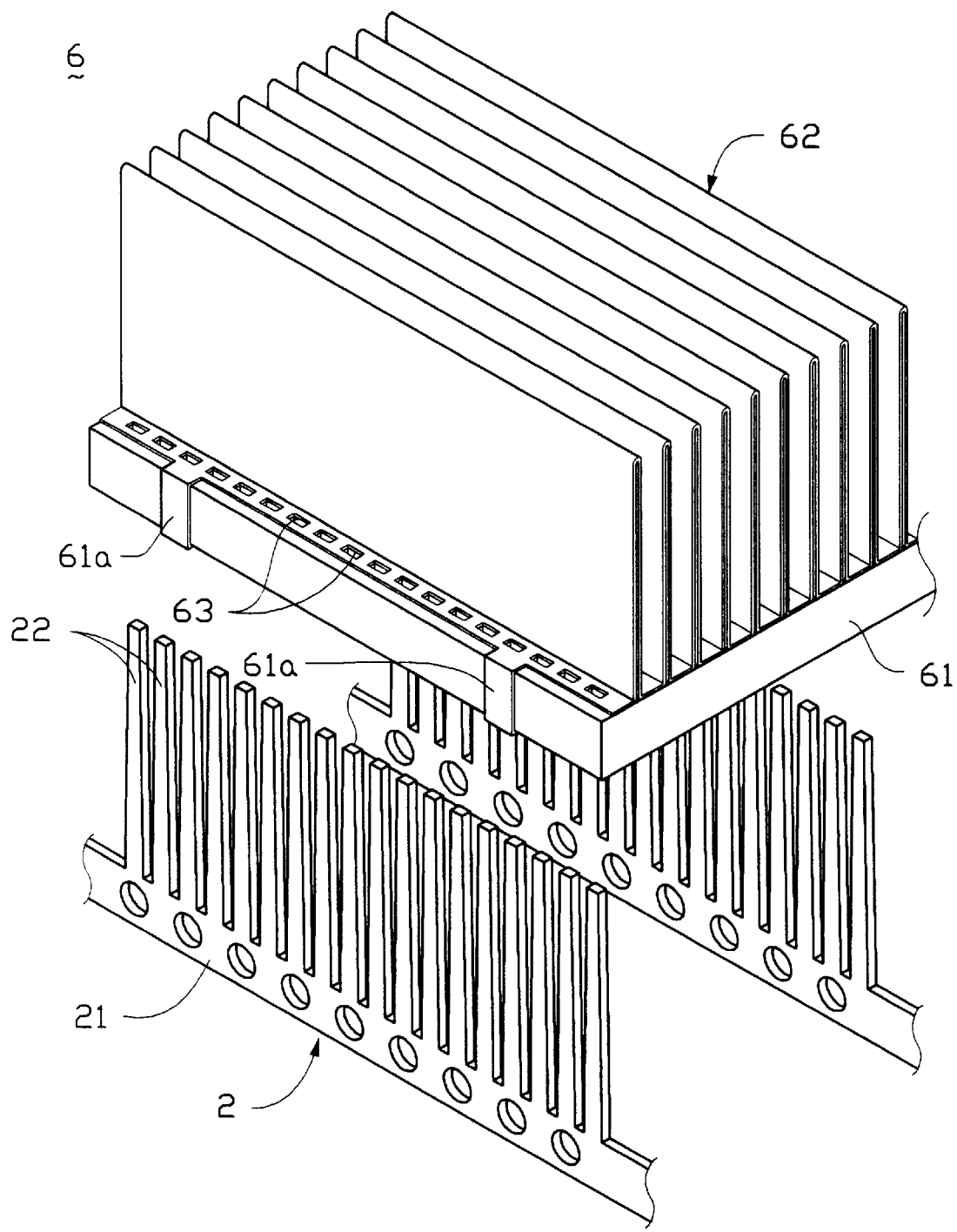
FIG. 7 a perspective view of a heat sink made in accordance with a fifth embodiment of the present invention.
Figure 8A:
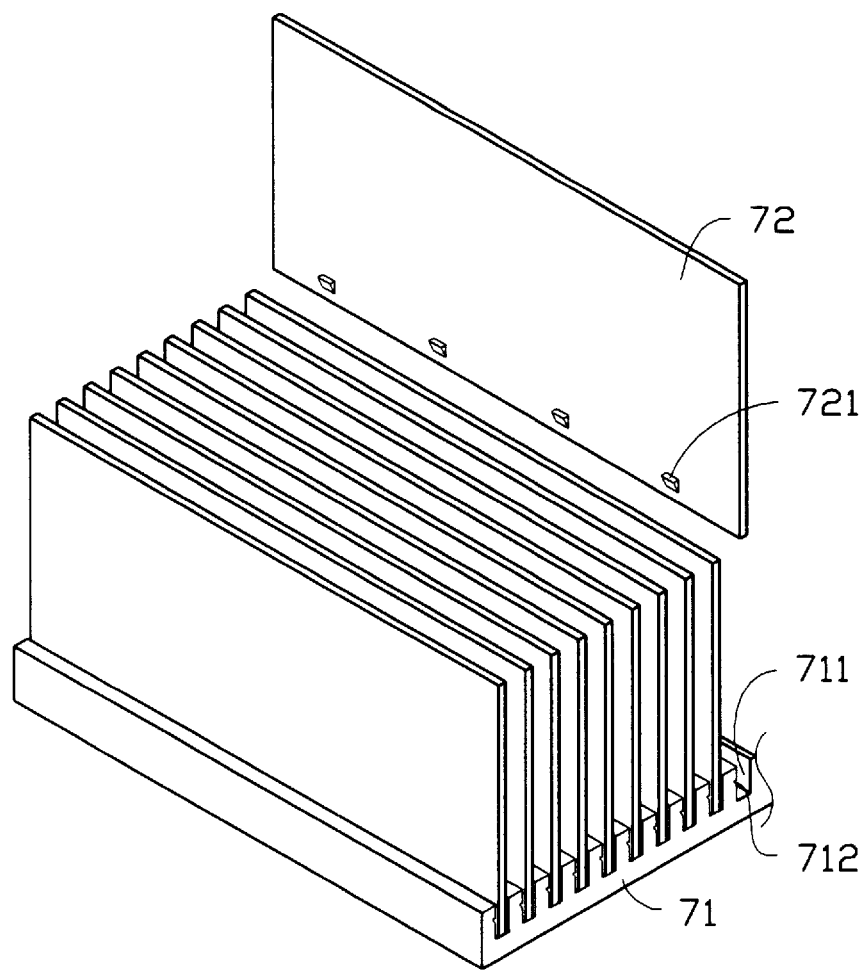
FIG. 8A is a perspective view of a heat sink disclosed in the '858 patent.
Figure 8B:
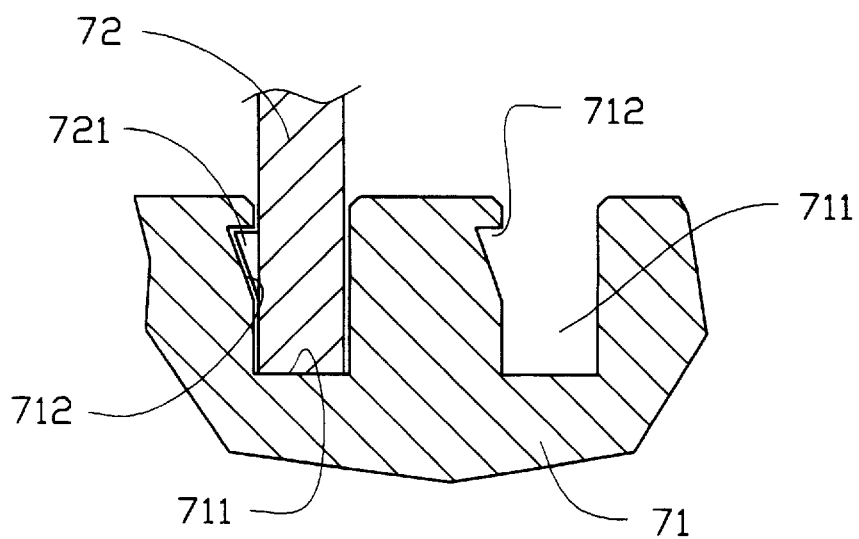
FIG. 8B is a side view FIG. 8A.
Figure 9:
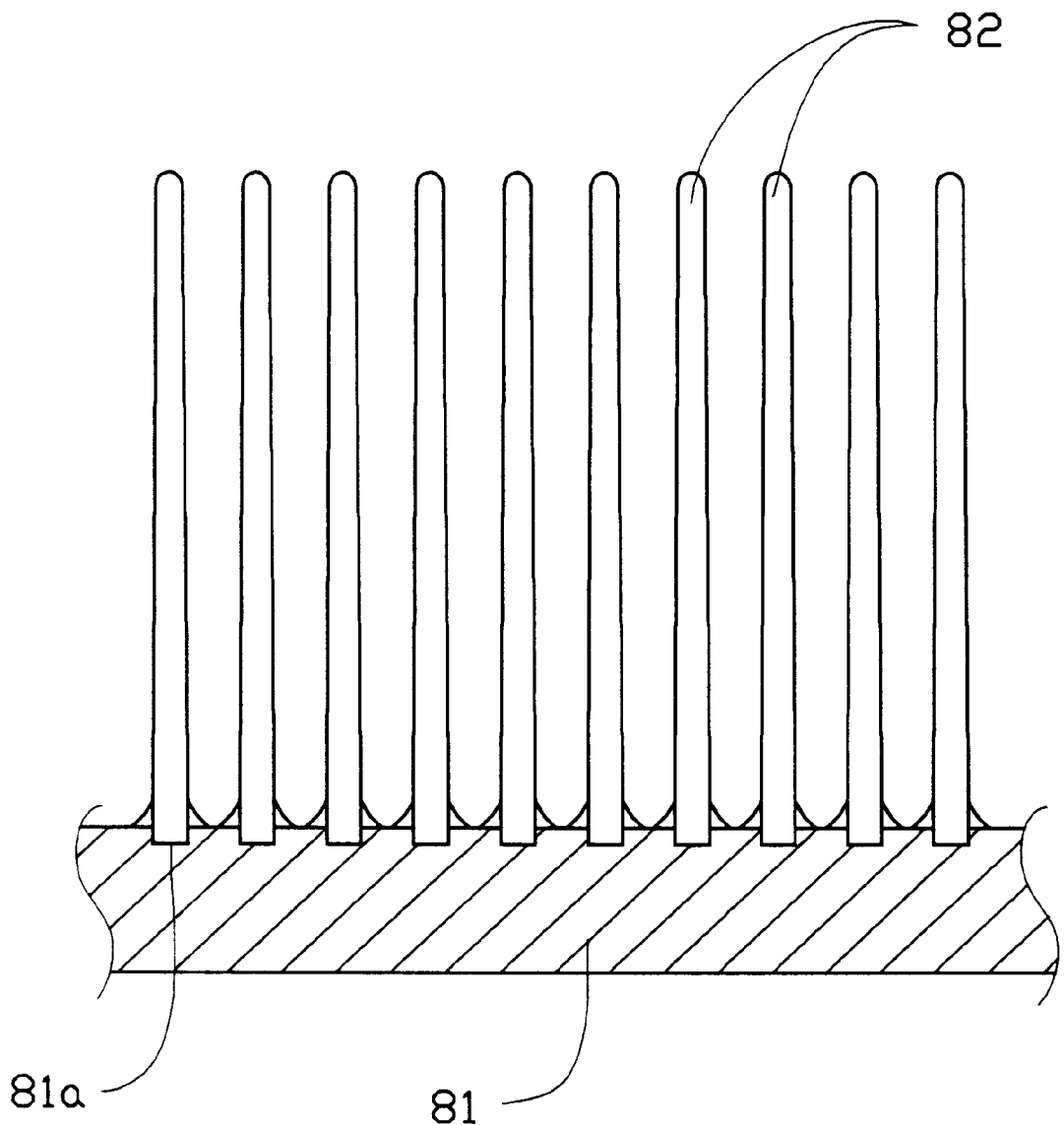
FIG. 9 is a cross sectional view of a conventional heat sink having cooling fins welded to a substrate.

FIG. 7 illustrates an application of the second cooling fins 22 mounted onto a conventional heat sink device 6. In this embodiment, the cooling plate 62 is directly folded from a metal plate. The cooling plate 62 is anchored onto a substrate 61 by means of a fastener 61a. The cooling plate 62 and the substrate 61 each defines mounting holes 63 for receiving second cooling fins 22 therein which increases the overall surface area.

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claims. Therefore, persons of ordinary skill in this field are to understand that all such equivalent structures are to be included within the scope of the following claims.

I claim:

1. A method for making a heat sink device for use with a CPU, comprising the steps of:
   1) providing a substrate defining at least two rows of mounting holes therein;
   2) forming a plurality of first cooling fin strips;
   3) aligning each first cooling fin strip with said corresponding row of mounting holes; and
   4) inserting each first cooling fin into said corresponding mounting hole.

2. A method as recited in claim 1, further comprising a step of forming a plurality of second cooling fins extending vertically from a top face of said substrate.

3. A method as recited in claim 2, wherein said substrate defining at least two rows of mounting holes therein and each said second cooling fin is located between two rows of mounting holes.

4. A method as recited in claim 2, wherein said second cooling fins are tangs.

5. A method as recited in claim 2, wherein said second cooling fins are plates arranged parallel to each other.

6. A method as recited in claim 1, wherein said second cooling fins strip is directly stamped from a material sheet.

7. A method as recited in claim 1, further comprising the step of cutting a redundant material portion from said first cooling fin strips.

8. A method as recited in claim 1, wherein each said first cooling fin strip is inserted into said mounting holes from a bottom surface of said substrate.

* * * * *